United States Patent
Lee et al.

(10) Patent No.: US 8,431,990 B2
(45) Date of Patent: Apr. 30, 2013

(54) SEMICONDUCTOR DEVICE

(75) Inventors: Nam-Young Lee, Yongin-si (KR); Mueng-Ryul Lee, Seoul (KR)

(73) Assignee: Samsung Electronics Co., Ltd. (KR)

( * ) Notice: Subject to any disclaimer, the term of this patent is extended or adjusted under 35 U.S.C. 154(b) by 397 days.

(21) Appl. No.: 12/798,572

(22) Filed: Apr. 7, 2010

(65) Prior Publication Data

US 2010/0258867 A1 Oct. 14, 2010

(30) Foreign Application Priority Data

Apr. 8, 2009 (KR) .......................... 10-2009-0030376

(51) Int. Cl.
*H01L 29/78* (2006.01)

(52) U.S. Cl.
USPC ........... 257/339; 257/335; 257/327; 257/288; 257/213; 257/E29.261

(58) Field of Classification Search .................. 257/335, 257/339, 327, 288, 213, E29.261
See application file for complete search history.

(56) References Cited

U.S. PATENT DOCUMENTS

| | | | | |
|---|---|---|---|---|
| 6,207,994 B1* | 3/2001 | Rumennik et al. | ............ | 257/342 |
| 6,909,143 B2* | 6/2005 | Jeon et al. | ............ | 257/335 |
| 6,914,294 B2* | 7/2005 | Nakamura et al. | ............ | 257/328 |
| 6,979,875 B2* | 12/2005 | Kwon et al. | ............ | 257/492 |
| 7,468,537 B2* | 12/2008 | Pendharkar | ............ | 257/335 |
| 7,589,378 B2* | 9/2009 | Kocon et al. | ............ | 257/343 |
| 7,605,040 B2* | 10/2009 | Choi et al. | ............ | 438/286 |
| 7,635,621 B2* | 12/2009 | McCormack et al. | ............ | 438/202 |
| 2002/0137292 A1* | 9/2002 | Hossain et al. | ............ | 438/289 |
| 2003/0173624 A1* | 9/2003 | Choi et al. | ............ | 257/368 |
| 2004/0201061 A1* | 10/2004 | Jeon et al. | ............ | 257/335 |
| 2004/0238913 A1* | 12/2004 | Kwon et al. | ............ | 257/492 |
| 2005/0139858 A1* | 6/2005 | Sung | ............ | 257/122 |
| 2006/0001102 A1* | 1/2006 | Pendharkar | ............ | 257/368 |
| 2006/0113592 A1* | 6/2006 | Pendharkar et al. | ............ | 257/335 |
| 2007/0114607 A1* | 5/2007 | Pendharkar | ............ | 257/343 |
| 2007/0246790 A1* | 10/2007 | Zinn et al. | ............ | 257/492 |
| 2007/0264785 A1* | 11/2007 | Choi et al. | ............ | 438/297 |
| 2009/0315113 A1* | 12/2009 | Vashchenko | ............ | 257/355 |
| 2010/0096697 A1* | 4/2010 | Su et al. | ............ | 257/343 |
| 2010/0140700 A1* | 6/2010 | Lee | ............ | 257/343 |
| 2011/0215402 A1* | 9/2011 | Lee | ............ | 257/335 |

* cited by examiner

*Primary Examiner* — Matthew W Such
*Assistant Examiner* — William Harriston
(74) *Attorney, Agent, or Firm* — Onello & Mello, LLP

(57) ABSTRACT

A semiconductor device comprises a substrate and a gate which extends on the substrate in a first horizontal direction. A source region is positioned at a first side of the gate and extends in the first direction. A body region of a first conductivity type is under the source region and extends in the first direction. A drain region of a second conductivity type is at a second side of the gate and extends in the first direction. A drift region of the second conductivity type extends between the body region and the drain region in the substrate in a second horizontal direction. A first buried layer is under the drift region in the substrate, the first buried layer extending in the first and second directions. A plurality of second buried layers is between the first buried layer and the drift region in the substrate. The second buried layers extend in the second direction and are spaced apart from each other in the first direction.

8 Claims, 15 Drawing Sheets

SEMICONDUCTOR DEVICE

This application claims priority from Korean Patent Application No. 10-2009-0030376 filed on Apr. 8, 2009 in the Korean Intellectual Property Office, the disclosure of which is incorporated herein by reference in its entirety.

BACKGROUND

1. Field of the Invention

Embodiments of the present inventive concept relate to a semiconductor device, and more particularly, to a semiconductor device having improved properties.

2. Description of the Related Art

Conventional power metal-oxide-semiconductor field-effect transistors (MOSFETs) have a higher power gain and a relatively more simple gate-driving circuit than bipolar transistors. In addition, while being turned off, power MOSFETs do not experience a time delay caused by accumulation or recombination of minority carriers. Therefore, power MOSFETs are widely employed as control, logic, and power switching devices.

Of the various types of power MOSFETs, double-diffused MOSFETs (DMOSs) using double diffusion technology, such as lateral double-diffused MOSFETs (LDMOSs), are being widely used.

SUMMARY

Aspects of the present inventive concept provide a semiconductor device having increased breakdown voltage and reduced turn-off resistance.

Aspects of the present invention are not however thus restricted. The above and other aspects of the present inventive concepts will become more apparent to one of ordinary skill in the art to which the present inventive concepts pertain by referencing the detailed description of the embodiments given below.

In one aspect, a semiconductor device comprises: a substrate; a gate which extends on the substrate in a first horizontal direction; a source region at a first side of the gate and extending in the first direction; a body region of a first conductivity type under the source region and extending in the first direction; a drain region of a second conductivity type at a second side of the gate and extending in the first direction; a drift region of the second conductivity type and extending between the body region and the drain region in the substrate in a second horizontal direction; a first buried layer under the drift region in the substrate, the first buried layer extending in the first and second directions; and a plurality of second buried layers between the first buried layer and the drift region in the substrate, the second buried layers extending in the second direction and being spaced apart from each other in the first direction.

In one embodiment, the first buried layer is of the second conductivity type, wherein the second buried layers are of the first conductivity type, and wherein the first buried layer has a higher doping concentration than the second buried layers.

In another embodiment, the source region comprises a first source region of the first conductivity type and a second source region of the second conductivity type, and wherein the body region contacts the second buried layers.

In another embodiment, the semiconductor device further comprises an element isolation region between the source region and the drain region in the substrate, wherein the gate is formed on a portion of the drift region and a portion of the element isolation region.

In another embodiment, the substrate comprises a bulk substrate of the first conductivity type and an epitaxial semiconductor layer of the second conductivity type on the bulk substrate, wherein the first buried layer is formed in the bulk substrate, wherein the second buried layers are formed in the epitaxial semiconductor layer, and wherein the drift region is spaced apart from the second buried layers and is disposed on the epitaxial semiconductor layer.

In another embodiment, the semiconductor device further comprises a well of the second conductivity type at the second side of the gate and extending in the first direction, wherein the well is under the drain region and extends deeper than the drift region in a vertical direction toward the second buried layers.

In another embodiment, the first buried layer is of the second conductivity type, wherein the second buried layers are of the first conductivity type, wherein the first buried layer has a higher doping concentration than the second buried layers, and wherein the second buried layers have a higher doping concentration than the well.

In another embodiment, the first and second buried layers extend from the body region in the second direction, and wherein the second buried layers extend further than the first buried layer in the second direction.

In another aspect, a semiconductor device comprises: a substrate which comprises a first region and a second region adjacent to the first region in a first horizontal direction; a source region in the first and second regions of the substrate and extending in the first direction; a body region of a first conductivity type under the source region in the first and second regions of the substrate and extending in the first direction; a drain region of a second conductivity type spaced apart from the body region in a second horizontal direction and extending in the first direction in the first and second regions of the substrate; a drift region of the second conductivity type extending between the body region and the drain region and extending in the first direction in the first and second regions of the substrate; a first buried layer under the drift region and extending from the body region in the second direction, the first buried layer being in the first and second regions of the substrate; and a second buried layer between the first buried layer and the drift region, the second buried layer extending from the body region in the second direction, and the second buried layer being formed in any one of the first and second regions of the substrate.

In another aspect, a semiconductor device comprises: a substrate; a source region in the substrate along a first horizontal direction; a body region of a first conductivity type under the source region and formed in the substrate to extend the first direction; a drain region of a second conductivity type which is spaced apart from the body region in a second horizontal direction and extending in the first direction; a drift region of the second conductivity type extending from the body region to the drain region in the substrate in a second horizontal direction; a first buried layer under the drift region and extending from the body region in the second direction; and a second buried layer between the first buried layer and the drift region and extending from the body region further than the first buried layer in the second direction.

BRIEF DESCRIPTION OF THE DRAWINGS

The above and other aspects and features of the present inventive concepts will become more apparent by describing in detail exemplary embodiments thereof with reference to the attached drawings, in which.

DETAILED DESCRIPTION OF EMBODIMENTS

Figure 1:
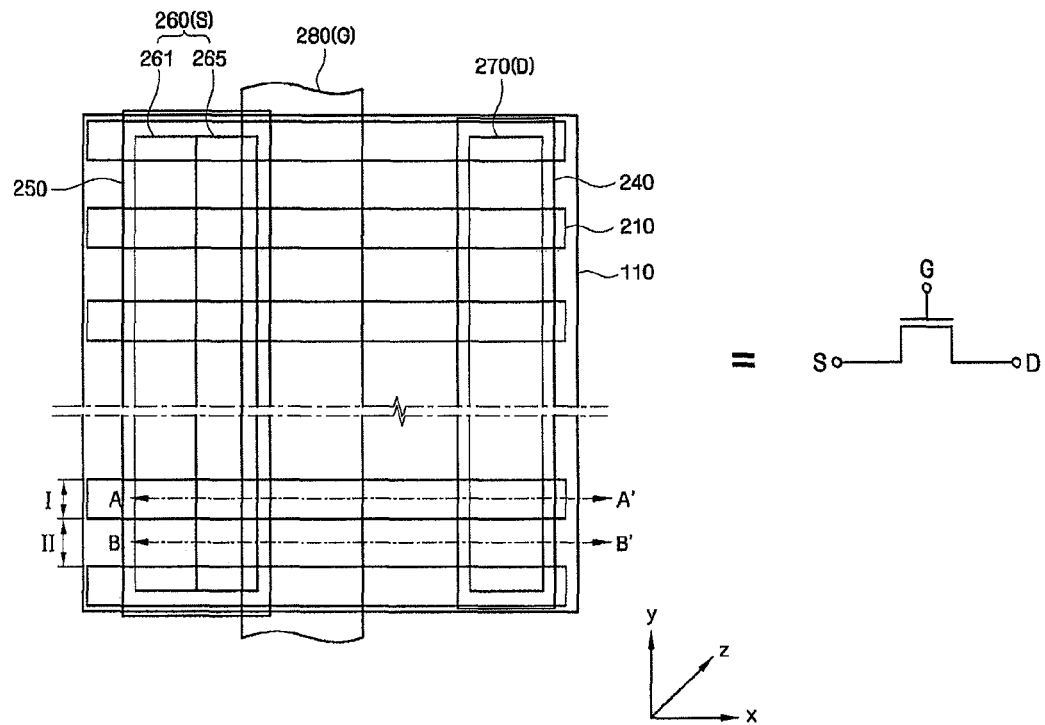
FIG. 1 is a layout view of a semiconductor device according to a first exemplary embodiment.

Various exemplary embodiments will be described more fully hereinafter with reference to the accompanying drawings, in which some exemplary embodiments are shown. The present inventive concept may, however, be embodied in many different forms and should not be construed as limited to the exemplary embodiments set forth herein.

It will be understood that when an element or layer is referred to as being "on," "connected to" or "coupled to" another element or layer, it can be directly on, connected or coupled to the other element or layer or intervening elements or layers may be present. In contrast, when an element is referred to as being "directly on," "directly connected to" or "directly coupled to" another element or layer, there are no intervening elements or layers present. Like numerals refer to like elements throughout. As used herein, the term "and/or" includes any and all combinations of one or more of the associated listed items.

It will be understood that, although the terms first, second, third, etc. may be used herein to describe various elements, components, regions, layers and/or sections, these elements, components, regions, layers and/or sections should not be limited by these terms. These terms are only used to distinguish one element, component, region, layer or section from another region, layer or section. Thus, a first element, component, region, layer or section discussed below could be termed a second element, component, region, layer or section without departing from the teachings of the present inventive concept.

Spatially relative terms, such as "beneath," "below," "lower," "above," "upper" and the like, may be used herein for ease of description to describe one element's or feature's relationship to another element(s) or feature(s) as illustrated in the figures. It will be understood that the spatially relative terms are intended to encompass different orientations of the device in use or operation in addition to the orientation depicted in the figures. For example, if the device in the figures is turned over, elements described as "below" or "beneath" other elements or features would then be oriented "above" the other elements or features. Thus, the exemplary term "below" can encompass both an orientation of above and below. The device may be otherwise oriented (rotated 90 degrees or at other orientations) and the spatially relative descriptors used herein interpreted accordingly.

The terminology used herein is for the purpose of describing particular exemplary embodiments only and is not intended to be limiting of the present inventive concept. As used herein, the singular forms "a," "an" and "the" are intended to include the plural forms as well, unless the context clearly indicates otherwise. It will be further understood that the terms "comprises" and/or "comprising," when used in this specification, specify the presence of stated features, integers, steps, operations, elements, and/or components, but do not preclude the presence or addition of one or more other features, integers, steps, operations, elements, components, and/or groups thereof.

Exemplary embodiments are described herein with reference to cross-sectional illustrations that are schematic illustrations of idealized exemplary embodiments (and intermediate structures). As such, variations from the shapes of the illustrations as a result, for example, of manufacturing techniques and/or tolerances, are to be expected. Thus, exemplary embodiments should not be construed as limited to the particular shapes of regions illustrated herein but are to include deviations in shapes that result, for example, from manufacturing. For example, an implanted region illustrated as a rectangle will, typically, have rounded or curved features and/or a gradient of implant concentration at. its edges rather than a binary change from implanted to non-implanted region. Likewise, a buried region formed by implantation may result in some implantation in the region between the buried region and the surface through which the implantation takes place. Thus, the regions illustrated in the figures are schematic in nature and their shapes are not intended to illustrate the actual shape of a region of a device and are not intended to limit the scope of the present inventive concept.

Hereinafter, semiconductor devices according to exemplary embodiments of the present invention will be described using a lateral double-diffused metal-oxide-semiconductor-field-effect transistor (LDMOS) structure as an example. However, the present is not limited to the LDMOS structure, and lateral high-voltage transistor structures (such as an insulator gate bipolar transistor (IGBT)) similar to the LDMOS structure can also be used. In addition, while an N-type LDMOS will be described as an example, a P-type LDMOS can also be applied in the present invention. It is obvious that the N type and the P type can be reversed.

Figure 2:
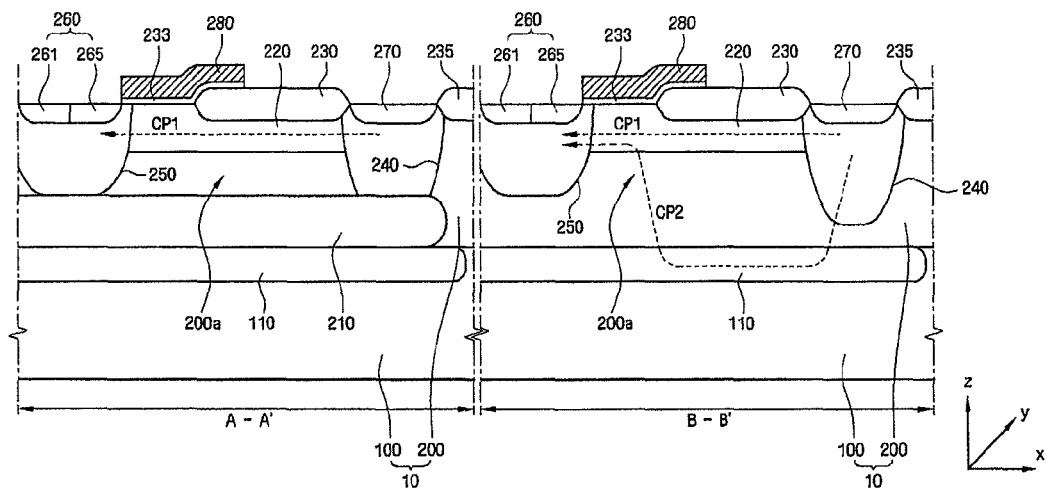
FIG. 2 is a cross-sectional view of the semiconductor device taken along the lines A-A' and B-B' of FIG. 1.
Figure 3:
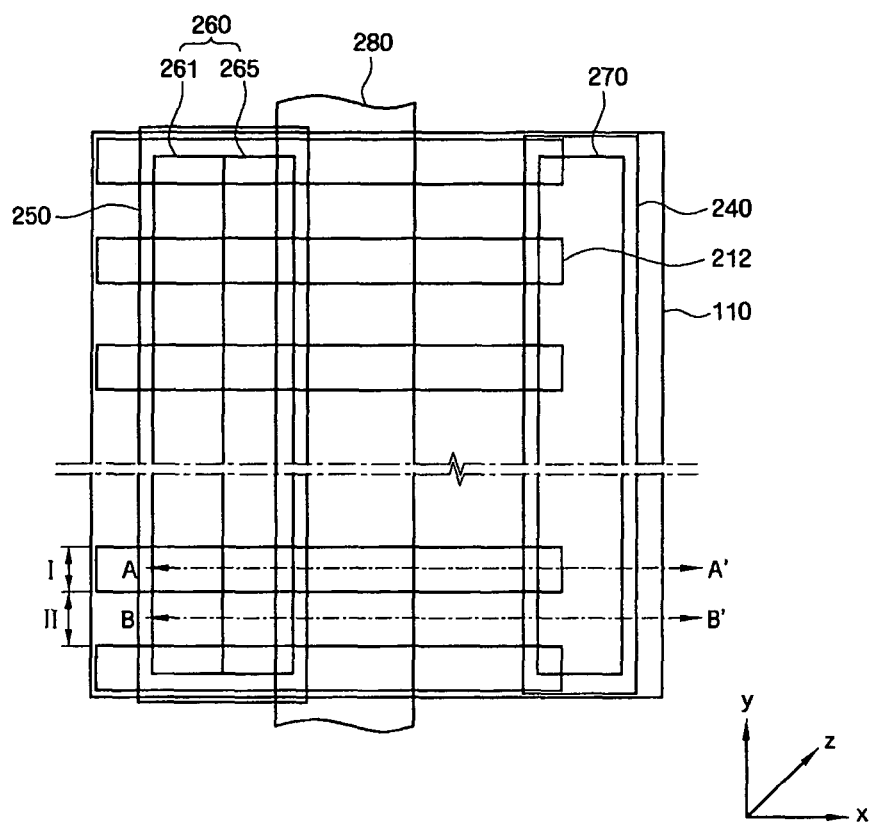
FIGS. 3 through 5 are views illustrating modified versions of the semiconductor device according to the first exemplary embodiment.
Figure 4:
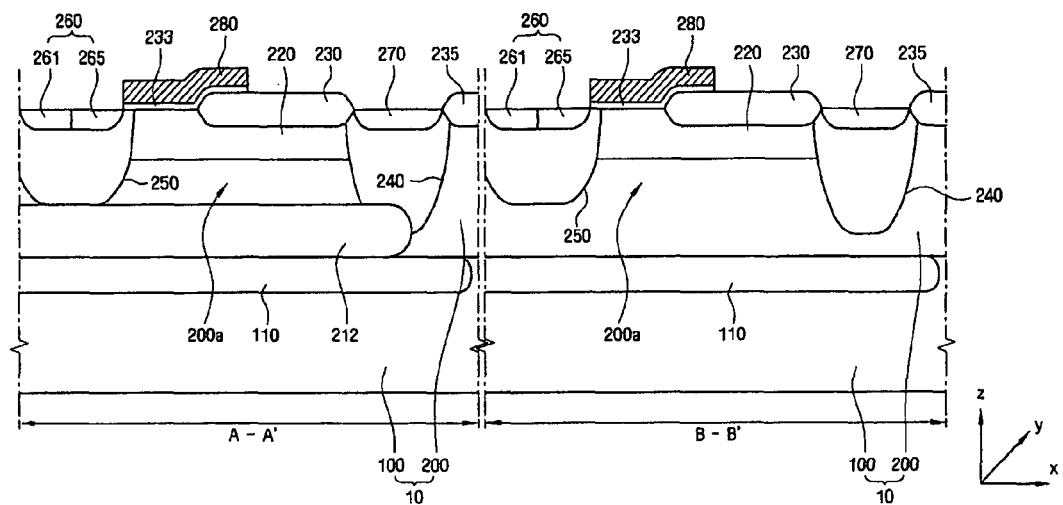
Figure 5:
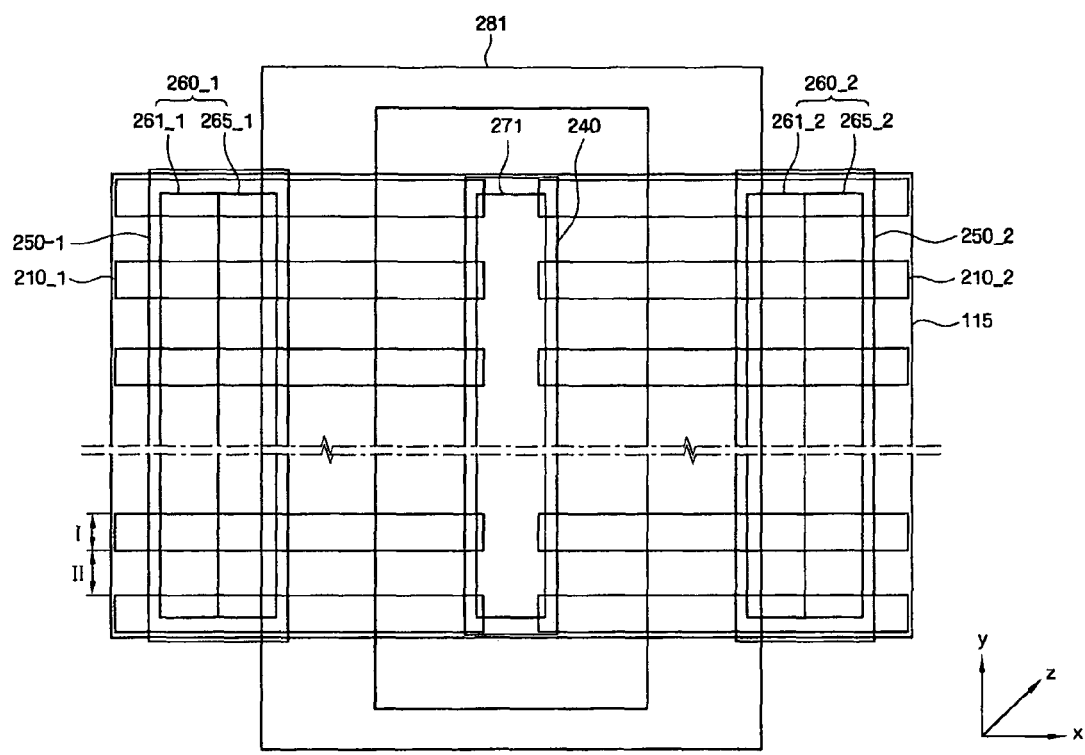

FIG. 1 is a layout view of a semiconductor device according to a first exemplary embodiment. FIG. 2 is a cross-sectional view of the semiconductor device taken along the lines A-A' and B-B' of FIG. 1. FIGS. 3 through 5 are views showing modified versions of the semiconductor device according to the first exemplary embodiment. For simplicity, a drift region is not illustrated in the layout views of FIGS. 1, 3, and 5.

Referring to FIGS. 1 and 2, the semiconductor device according to the first exemplary embodiment includes a gate 280 which is formed on a substrate 10, a body region 250 and a source region 260 which are formed on a side (hereinafter, referred to as a first side) of the gate 280, a drain region 270 and a first element isolation region 235 which are formed on the other side (hereinafter, referred to as a second side) of the gate 280, a drift region 220 which extends from the body region 250 to the drain region 270 within the substrate 10, and a first buried layer 110 and a second buried layer 210 which are formed under the drift region 220.

The substrate 10 includes a first region I and a second region II which is adjacent to the first region I in a first direction (e.g., in the y-axis direction). The substrate 10 includes a P-type bulk substrate 100 and an N-type epitaxial layer 200 which is formed on the bulk substrate 100. The bulk substrate 100 may comprise, for example, a silicon semiconductor substrate, a gallium arsenic semiconductor substrate, a silicon germanium semiconductor substrate, a ceramic semiconductor substrate, a quartz semiconductor substrate, or a glass semiconductor substrate for displays.

The gate 280 extends in the first and second regions I and II of the substrate 10 in the first direction. Specifically, the gate 280 extends on a part of the drift region 220 and on a part of a second element isolation region 230 in the first direction. The gate 280 may be made of polysilicon. In other embodiments, the gate 280 can be formed of other suitable materials, such as various conductive materials such as metal, a combination of metal and polysilicon, and the like. A gate insulating film 233 is formed under the gate 280 to electrically isolate the gate 233 from the substrate 10.

The second element isolation region 230 separates the gate 280 from the drain region 270. The second element isolation region 230 prevents the reliability of the semiconductor device from deteriorating due to a high electric field that can be present between the drain region 270 and an edge of the gate 280 when a high voltage is applied to the drain region 270. The second element isolation region 230 may comprise, but is not limited to, a local oxidation of silicon (LOCOS) region or a shallow trench isolation (STI) region.

The source region 260 is formed on the first side of the gate 280 along the first direction, and a source voltage is applied to the source region 260. The source region 260 includes a P-type first source region 261 and an N-type second source region 265. Although not shown in the drawings, a silicide film may be formed on the source region 260 to reduce the resistance between the source region 260 and a source electrode.

The P-type body region 250 is formed on the first side of the gate 280 along the first direction. Specifically, the body region 250 is formed under the source region 260 to surround the source region 260. In addition, the body region 250 extends deeper into the substrate 10 than the drift region 220 to substantially contact the second buried layers 210. The body region 250 may have a lower doping concentration than the source region 260 and the drain region 270. Here, a doing concentration may denote the concentration of impurities with which each region is doped (or implanted).

The N-type drain region 270 is formed on the second side of the gate 280 along the first direction, and a drain voltage is applied to the drain region 270. Although not shown in the drawings, a silicide film may be formed on the drain region 270 to reduce the resistance between the drain region 270 and a drain electrode.

An N-type well 240 is formed under the drain region 270. Specifically, the N-type well 240 is formed under the drain region 270 to surround the drain region 270. In addition, the N-type well 240 extends deeper into the substrate 10 than the drift region 220. Even in a case where the N-type well 240 has the same conductivity type as the drain region 270, it can have a lower doping concentration than the drain region 270.

The N-type drift region 220 extends from the body region 250 to the drain region 270 in the substrate 10. Specifically, the drift region 220 may be disposed between the body region 250 and the N-type well 240. In addition, the drift region 220 may be separated from, or otherwise spaced apart from, the second buried layers 210 and may be disposed on the epitaxial layer 200. The drift region 220 may have the same conductivity type as the N-type well 240 and the epitaxial layer 200 and may have a lower doping concentration than the drain region 270 and the body region 250. Accordingly, when a reverse bias is applied to the source region 260 and the drain region 270, a depletion region can be more readily formed in a region (e.g., the drift region 220, a portion 200a of the epitaxial layer 200, and the N-type well 240) between the body region 250 and the drain region 270 in a horizontal direction (e.g., in the x-axis direction) of the substrate 10. Here, the portion 200a of the epitaxial layer 200 may be disposed between the body region 250 and the drain region 270.

In the first exemplary embodiment of the present inventive concepts, the drift region 220 has a higher doping concentration than the epitaxial layer 200. Thus, when a voltage higher than a breakdown voltage is applied to the source region 260 and the drain region 270, an electric current may flow from the drain region 270 to the source region 260 more readily through the drift region 220 than through the epitaxial layer 200. Accordingly, when a voltage higher than a threshold voltage is applied to the gate 280 and when a voltage is applied to the source region 260 and the drain region 270, an electric current may more readily flow from the drain region 270 to the source region 260 along a first current path CP1, thereby reducing the turn-on resistance of the semiconductor device.

In summary, in the first exemplary embodiment of the present invention, the portion 200a of the epitaxial layer 200 which has a sufficiently low doping concentration and the drift region 220 which has a somewhat higher doping concentration than the portion 200a of the epitaxial layer 200 are formed between the body region 250 and the drain region 270. Therefore, a depletion region can be more readily formed in the region between the body region 250 and the drain region 270 before the semiconductor device is turned on. Consequently, the breakdown voltage of the semiconductor device can be increased, and the turn-on resistance of the semiconductor device can be reduced because the first current path CP1 is formed after the semiconductor device is turned on.

The P-type second buried layers 210 are disposed between the drift region 220 and the first buried layer 110 and extend from the body region 250 in a second direction (e.g., the x-axis direction). The second buried layers 210 may substantially contact the body region 250 to form an electric field using a source voltage in a vertical direction (e.g., a z-axis direction) of the semiconductor device. That is, an electric field is formed in the region (specifically, the drift region 220, the portion 220a of the epitaxial layer 200, and the N-type well 240) between the body region 250 and the drain region 270 in both of the horizontal and vertical directions of the substrate 10, thereby bringing about a reduced surface field (RESURF) effect.

Specifically, the second buried layers 210 may form a depletion region in the region between the body region 250 and the drain region 270 in the vertical direction. Moreover, the depletion region formed in the vertical direction may more effectively cause a depletion region to be formed in the region between the body region 250 and the drain region 270 in the horizontal direction. In this manner, if a depletion region is fully formed in the region between the body region 250 and the drain region 270, the breakdown voltage of the semiconductor device is not greatly affected by the doping concentration of the region between the body region 250 and the drain region 270. This not only increases the breakdown voltage of the semiconductor device but also effectively reduces the turn-on resistance of the semiconductor device.

The second buried layers 210 may have a higher doping concentration than the drift region 220 and the epitaxial layer 200 such that a depletion region can be more easily formed in the region between the body region 250 and the drain region 270 in the vertical direction.

In the first exemplary embodiment of the present invention, unlike the first buried layer 110, the second buried layers 210 are formed in any one (e.g., the first region I) of the first and second regions I and II of the substrate 10. That is, referring to FIG. 1, the semiconductor device that forms one LDMOS may include two or more second buried layers 210 which extend in the second direction (e.g., the y-axis direction) to cross the gate 280 and are separated from each other. If the second buried layers 210 are not formed in the second region II of the substrate 10, a second current path CP2 may be formed in the second region II to extend from the drain region 270 through the first buried layer 110 to the source region 260. Accordingly, when the semiconductor device is turned on, an electric current may flow from the drain region 270 to the source region 260 not only along the first current path CP1 but also along the second current path CP2 in the second region II of the substrate 10, thereby further reducing the turn-on resistance of the semiconductor device.

While the second buried layers 210 completely overlap the drain region 270 in FIGS. 1 and 2, the present invention is not limited thereto. For example, referring to FIGS. 3 and 4, second buried layers 212 may partially overlap a drain region 270 or may overlap a region between a source region 260 and the drain region 270.

The N-type first buried layer 110 is formed under the drift region 220 and extends from the body region 250 in the second direction. Specifically, unlike the second buried layers 210, the first buried layer 110 is formed on the bulk substrate 100 in the first and second regions I and II of the substrate 10 along the first direction. The first buried layer 110 assists the second buried layers 210 in forming a depletion region in the region between the body region 250 and the drain region 270 in the vertical direction. Specifically, the first buried layer 110 receives a drain voltage through the N-type well 240 in the first and second regions I and II of the substrate 10 and forms a vertical electric field between the first and second buried layers 110 and 210, thereby causing the second buried layers 210 to form a depletion region in an upper part of the substrate 10 rather than in a lower part of the substrate 10. Here, the first buried layer 110 may have a higher doping concentration than the second buried layers 210 such that the depletion region can be formed more effectively in the upper part of the substrate 10 by the second buried layers 210.

The semiconductor device described above includes one source region 260, one body region 250, one gate 280, and one drain region 270. However, embodiments of the present inventive concepts are not limited thereto. In another exemplary embodiment of the present invention shown in FIG. 5, source regions 260_1 and 260_2 which respectively include first and second source regions 261_1, 261_2, 265_1, and 265_2, body regions 250_1 and 250_2, and a gate 281 may be disposed symmetrical to each other with respect to a drain region 271. Unlike a first buried layer 115, second buried layers 210_1 and 210_2 may also be disposed symmetrical to each other with respect to the drain region 271. While the gate 281 shown in FIG. 5 is square, the shape of the gate 281 is not limited to the square shape. The gate 281 may also have various shapes.

Figure 6:
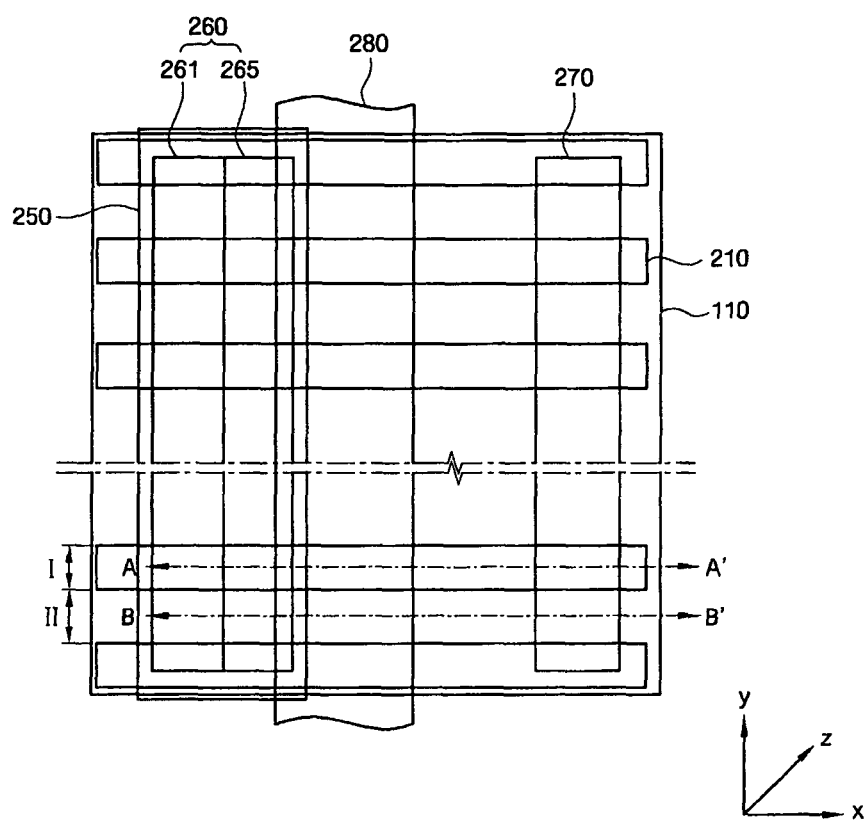
FIG. 6 is a layout view of a semiconductor device according to a second exemplary embodiment.
Figure 7:
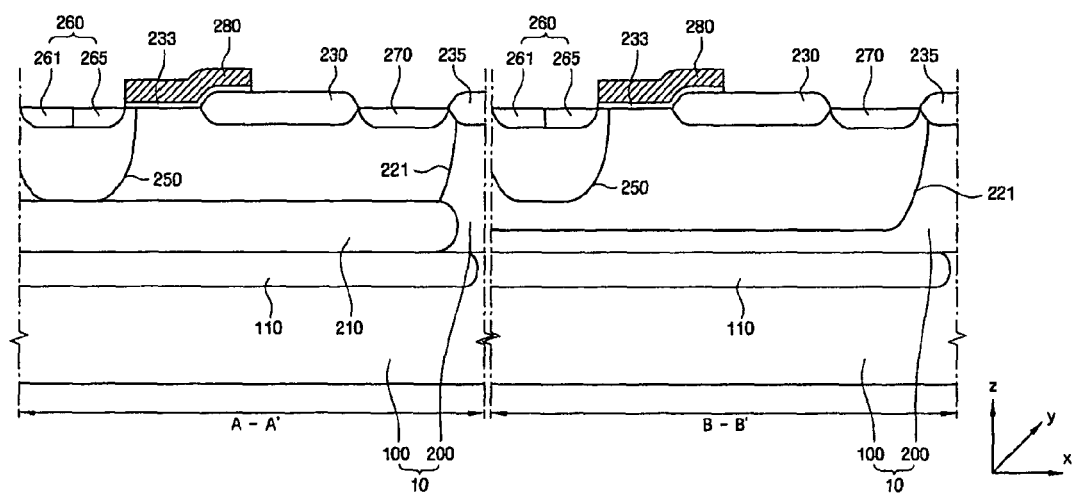
FIG. 7 is a cross-sectional view of the semiconductor device taken along the lines A-A' and B-B' of FIG. 6.

FIG. 6 is a layout view of a semiconductor device according to a second exemplary embodiment. FIG. 7 is a cross-sectional view of the semiconductor device taken along the lines A-A' and B-B' of FIG. 6. For simplicity, a drift region is not illustrated in FIG. 6.

Referring to FIGS. 6 and 7, the semiconductor device according to the second exemplary embodiment is substantially identical to the semiconductor device according to the first exemplary embodiment except in that it does not include an N-type well and except in that a drift region 221 extends deeper into a substrate 10 than the drift region 220 according to the first exemplary embodiment.

Specifically, the N-type drift region 221 extends from a body region 250 to a drain region 270 and surrounds the body region 250 and the drain region 270. In addition, the drift region 221 extends down into the substrate 10 to substantially contact the second buried layers 210. That is, the drift region 221 of the present embodiment of FIGS. 6 and 7 may operate in substantially the same manner as the drift region 220, the N-type well 240, and the portion 200a of the epitaxial layer 200 formed between the body region 250 and the drain region 270 of the embodiment of FIGS. 1 and 2.

The drift region 221 may have a lower doping concentration than the body region 250 and the drain region 270 but may have a higher doping concentration than an epitaxial layer 200. Accordingly, when a reverse bias is applied to a source region 260 and the drain region 270, a depletion region can be more readily formed in a region (specifically, the drift region 221) between the body region 250 and the drain region 270 in a horizontal direction of the substrate 10.

Figure 8:
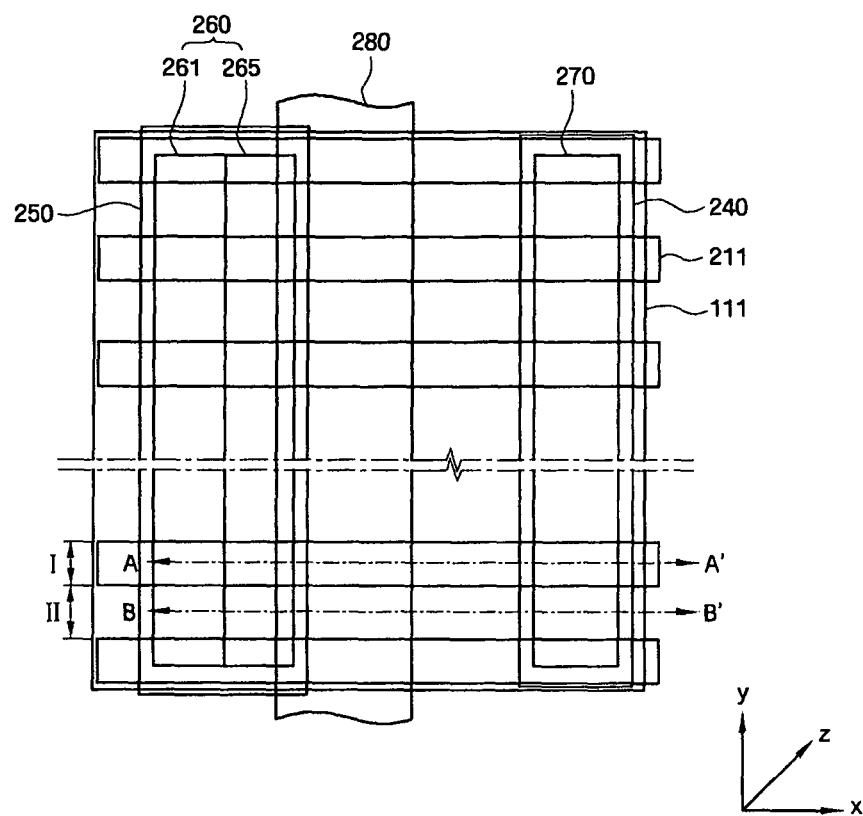
FIG. 8 is a layout view of a semiconductor device according to a third exemplary embodiment.
Figure 9:
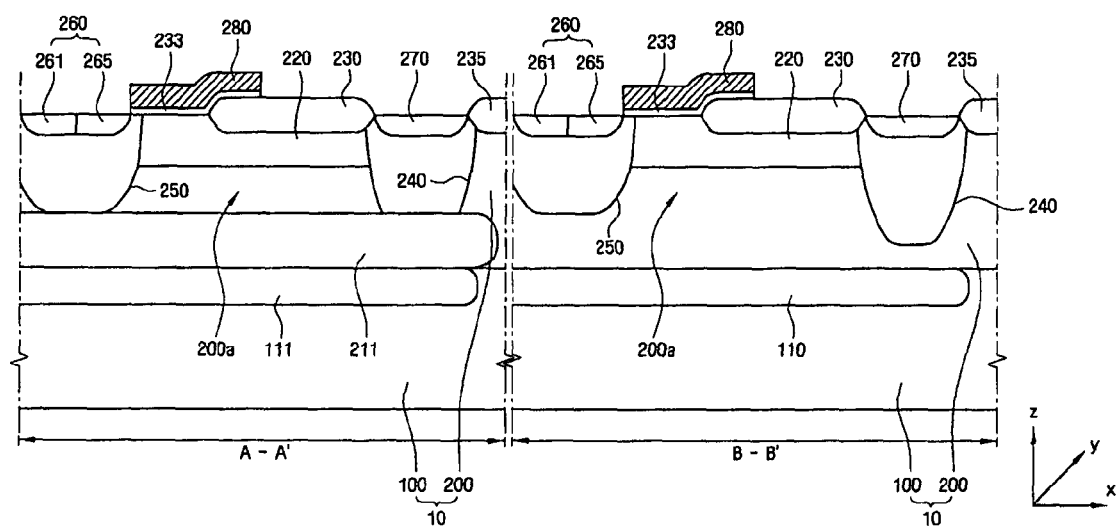
FIG. 9 is a cross-sectional view of the semiconductor device taken along the lines A-A' and B-B' of FIG. 8.

FIG. 8 is a layout view of a semiconductor device according to a third exemplary embodiment. FIG. 9 is a cross-sectional view of the semiconductor device taken along the lines A-A' and B-B' of FIG. 8. For simplicity, a drift region is not illustrated in FIG. 8.

Referring to FIGS. 8 and 9, the semiconductor device according to the third exemplary embodiment is substantially identical to the semiconductor device according to the first exemplary embodiment except in that, in the present embodiment, a second buried layer 211 extends further than the first buried layer 111 in a second horizontal direction.

Specifically, the second buried layers 211 may extend from a body region 250 to a drain region 270 further in the second horizontal direction than the first buried layer 111. Accordingly, a current path from the drain region 270 to the first buried layer 110 may be blocked in a first region I of a substrate 10, thereby electrically isolating the drain region 270 from the first buried layer 110. However, since the current path from the drain region 270 to the first buried layer 110 is not blocked in a second region II of the substrate 10, the drain region 270 can be electrically connected to the first buried layer 111 in the semiconductor device as a whole. Therefore, in the second region II of the substrate 10, a second current path CP2 (see FIG. 2) from the drain region 270 to the source region 260 can be formed. Furthermore, the first buried layer 111 can form a vertical electric field between the first and second buried layers 111 and 211 using a drain voltage, thereby generating the RESURF effect between the body region 250 and the drain region 270. That is, there are no restrictions on the disposition of the first and second buried layers 111 and 211 included in the semiconductor device according to the third exemplary embodiment. Thus, the second buried layers 211 are not made to extend less than the first buried layer 111 in the second direction such that the first buried layer 111 can be electrically connected to the drain region 270 to bring about the RESURF effect. The RESURF effect can be optimized by varying the disposition of the first and second buried layers 111 and 211 in the semiconductor device.

Figure 10:
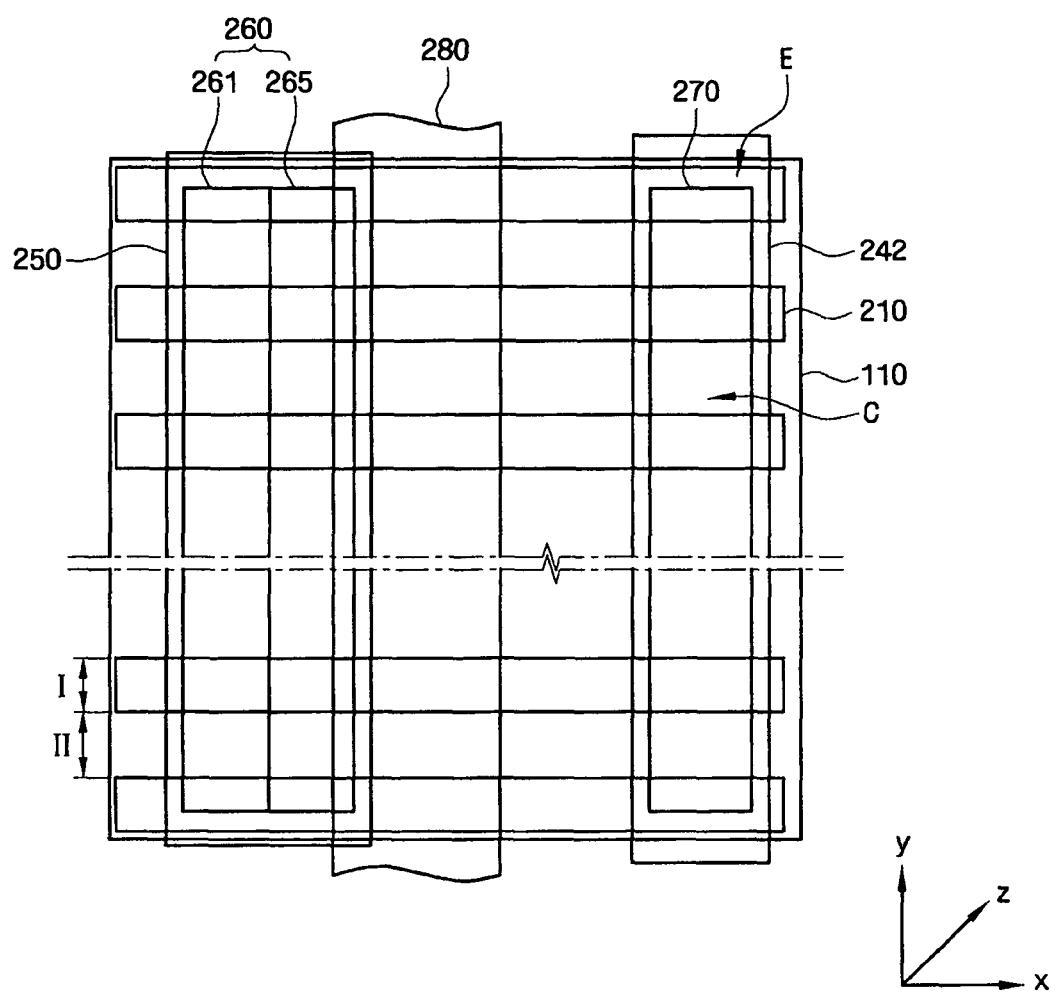
FIG. 10 is a layout view of a semiconductor device according to a fourth exemplary embodiment.

FIG. 10 is a layout view of a semiconductor device according to a fourth exemplary embodiment. For simplicity, a drift region is not illustrated in FIG. 10.

Referring to FIG. 10, the semiconductor device according to the fourth exemplary embodiment is substantially identical to the semiconductor device according to the first exemplary embodiment except in that an N-type well 242 according to the embodiment of FIG. 10 extends further than the N-type well 240 according to the first exemplary embodiment in a first direction.

Specifically, the N-type well 242 may extend further than first and last ones of two or more second buried layers 210 in the first direction, or in the direction of the y-axis. Accordingly, the first buried layer 110 can be electrically connected to a drain region 270 not only by a central portion C of the N-type well 240 which extends in the first direction but also by an edge portion E of the N-type well 240. That is, the first buried layer 110 and the drain region 270 can be electrically connected to each other more easily. This enhances the RESURF effect in the semiconductor device and effectively forms a second current path, thereby increasing the breakdown voltage of the semiconductor device and reducing the turn-on resistance of the semiconductor device.

Hereinafter, a method of fabricating the semiconductor device according to the first exemplary embodiment will be described with reference to FIGS. 1, 2, and 11A through 13B. FIGS. 11A through 13B are views for explaining a method of fabricating the semiconductor device according to the first exemplary embodiment. FIGS. 11B, 12B, and 13B are cross-sectional views of the semiconductor device taken along the lines A-A' and B-B' of FIGS. 11A, 12A, and 13A, respectively.

Figure 11A:
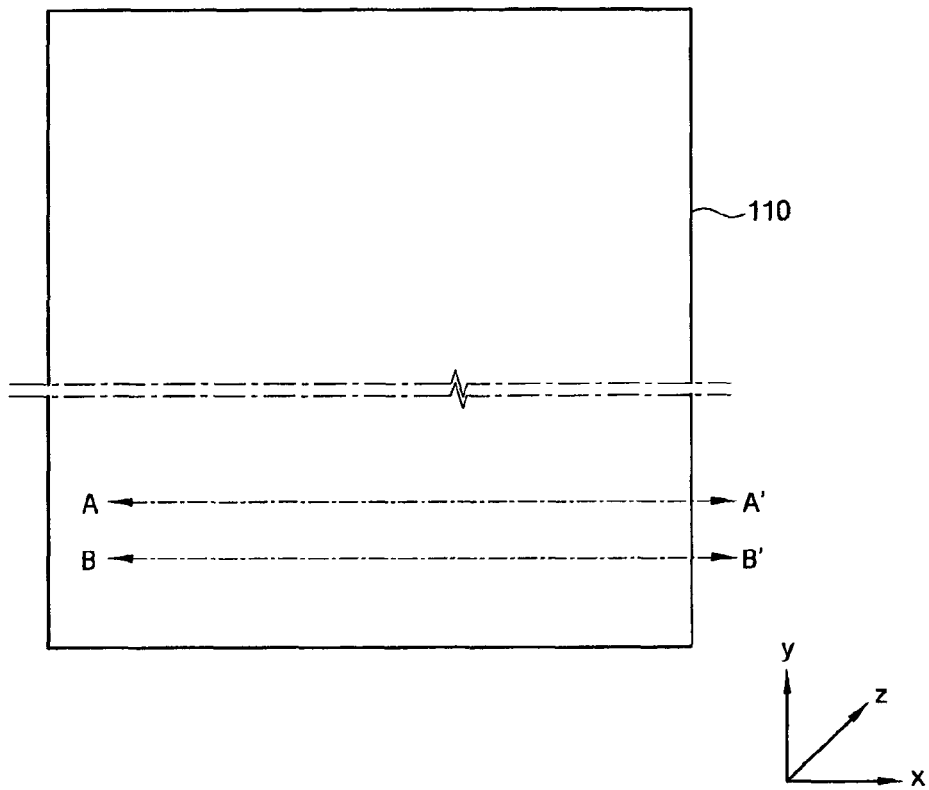
FIGS. 11A through 13B are views for explaining a method of fabricating the semiconductor device according to the first exemplary embodiment.
Figure 11B:
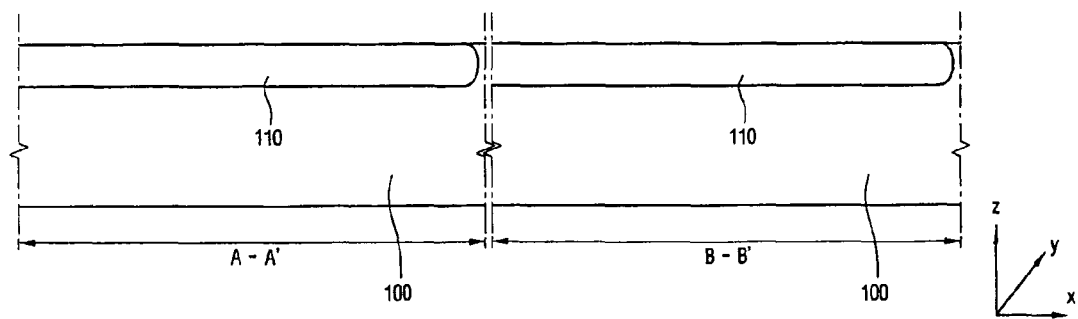

Referring to FIGS. 11A and 11B, the N-type first buried layer 110 is formed in the P-type bulk substrate 100. Specifically, a mask pattern (not shown) in which a region where the first buried layer 110 is to be formed is defined is formed on the bulk substrate 100, and N-type impurities are implanted into an upper part of the bulk substrate 100. Then, the mask pattern is removed to form the first buried layer 110. Here, the first buried layer 110 may be formed to have a higher doping concentration than the second buried layers 210 which will be formed in a subsequent process.

Figure 12A:
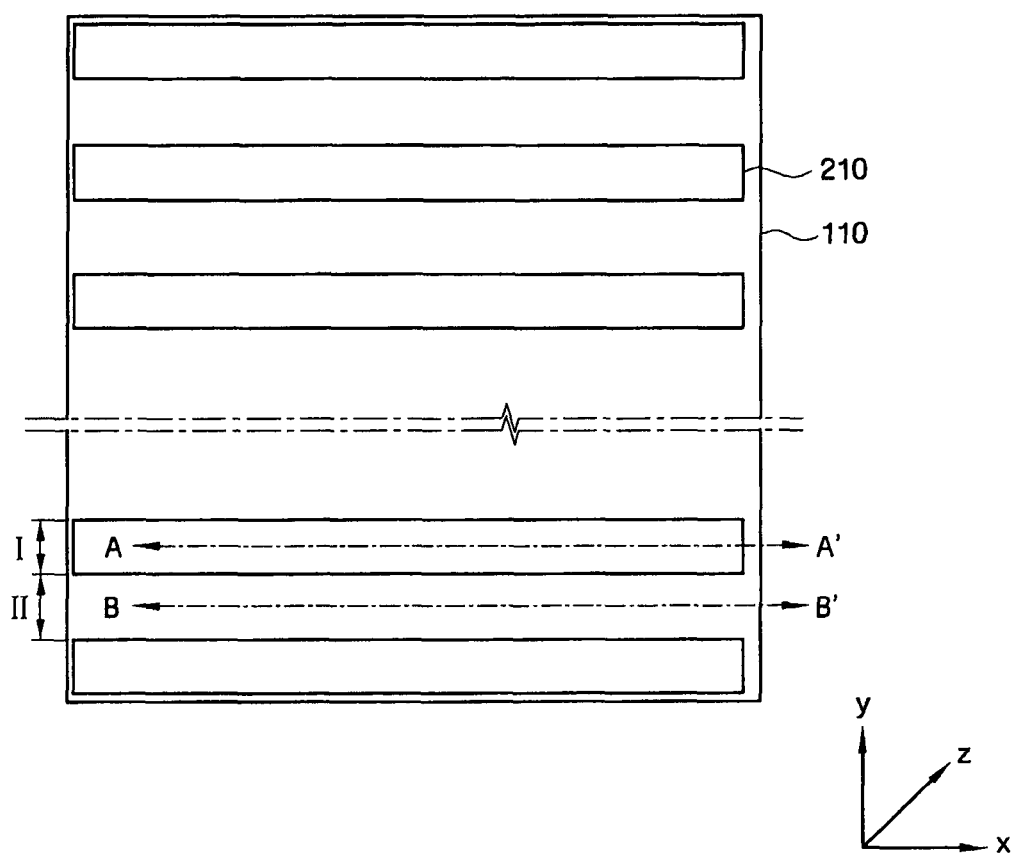
Figure 12B:
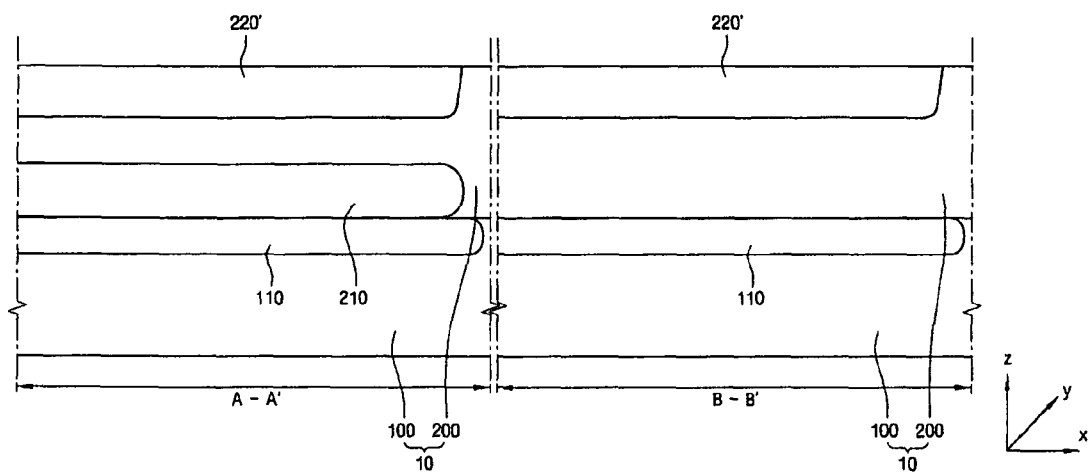

Referring to FIGS. 12A and 12B, the N-type epitaxial layer 200 is formed on the bulk substrate 100. The epitaxial layer 200 may be formed using, e.g., a selective epitaxial growth (SEG) method or a solid phase epitaxial (SPE) method.

The P-type second buried layers 210 and an N-type pre-drift region 220' are formed in the epitaxial layer 200. Specifically, a mask pattern in which regions where the second buried layers 210 are to be formed are defined (specifically, a mask pattern in which the first and second regions I and II of the substrate 10 are defined) is formed on the epitaxial layer 200. Then, P-type impurities are implanted into the epitaxial layer 200 to a depth equal to a top surface of the first buried layer 110 or a lower part of the epitaxial layer 200 disposed on the first buried layer 110 in the first region I of the substrate 10, and the mask pattern is removed to form the second buried layers 210. Next, a mask pattern (not shown) in which a region where the pre-drift region 220' is to be formed is defined on the epitaxial layer 200. Then, N-type impurities are implanted into an upper part of the epitaxial layer 200, and the mask pattern is removed to form the pre-drift region 220'. The second buried layers 210 formed as described above may have a higher doping concentration than the epitaxial layer 200 but have a lower doping concentration than the first buried layer 110. In addition, the pre-drift region 220' may have substantially the same doping concentration as the epitaxial layer 200 or may have a higher doping concentration than the epitaxial layer 200.

While a case where the pre-drift region 220' is formed after the second buried layers 210 has been described above, embodiments of the present inventive concepts are not limited to this case. In another example embodiment of the present invention, the second buried layers 210 may be formed after the pre-drift region 220' is formed.

Figure 13A:
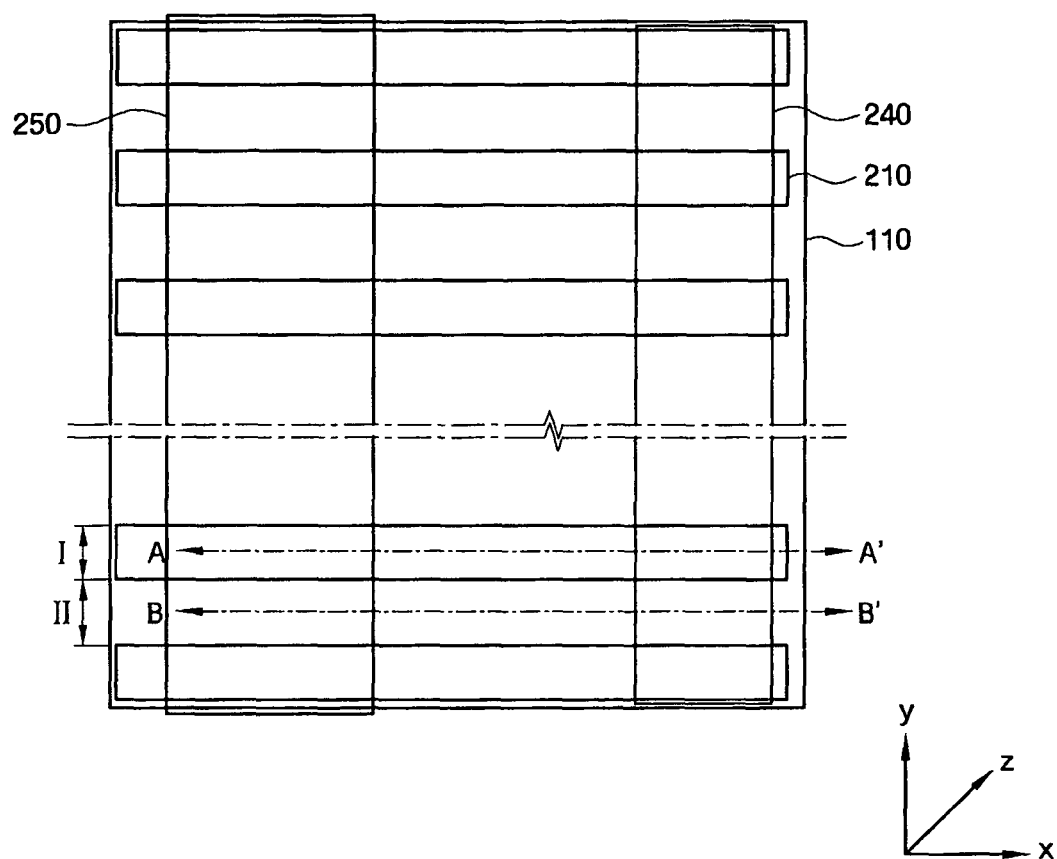
Figure 13B:
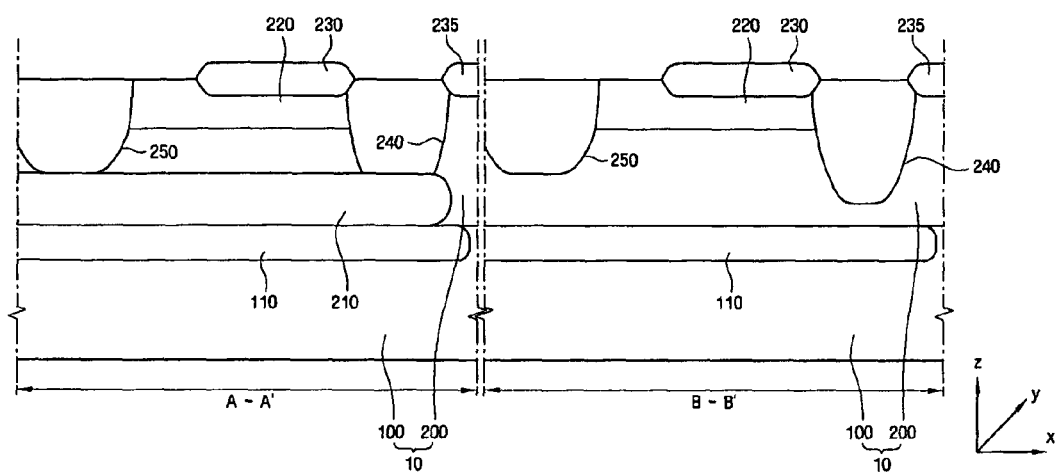

Referring to FIGS. 13A and 13B, the first and second element isolation regions 235 and 230 are formed in the epitaxial layer 200. Here, the first and second element isolation regions 235 and 230 may be formed LOCOS or STI regions.

Next, the N-type well 240 is formed between the first and second element isolation regions 235 and 230, and the P-type body region 250 is formed on the first side of the second element isolation region 230. Specifically, a mask pattern (not shown) in which a region where the N-type well 240 is to be formed is defined is formed on the substrate 10, and N-type impurities are implanted into the epitaxial layer 200 to a predetermined depth above the first buried layer 110. Then, the mask pattern is removed to form the N-type well 240. In addition, a mask pattern (not shown) in which a region where the body region 250 is to be formed is defined is formed on the substrate 10, and P-type impurities are implanted into the epitaxial layer 200 to a depth equal to top surfaces of the second buried layers 210. Then, the mask pattern is removed to form the body region 250. Here, the body region 250 may be formed by a multi-implantation process using different energies, so that it can contact the second buried layers 210. The multi-implantation process may be performed in the same lithography process or in different lithography processes. Accordingly, the drift region 220 between the body region 250 and the N-type well 240 is completed. The body region 250 may be formed to have a higher doping concentration than the drift region 220, the N-type well 240, and the epitaxial layer 200.

Referring to FIGS. 1 and 2, the gate insulating film 233 and the gate 280 are formed on a portion of the drift region 220 and on a portion of the second element isolation region 230. Specifically, a pre-gate insulating film such as a silicon oxide and a pre-gate such as polysilicon are sequentially stacked on the substrate 10 and then patterned to form the gate insulating film 233 and the gate 280.

Next, the source region 260 is formed on the first side of the gate 280, and the drain region 270 is formed on the second side of the gate 280. Here, the second source region 265 and the drain region 270 may be formed using N-type impurities, and the first source region 261 may be formed using P-type impurities. Accordingly, the source region 260 and the drain region 270 may have a higher doping concentration than the body region 250, the drift region 220, the N-type well 240, and the epitaxial layer 200.

Figure 14:
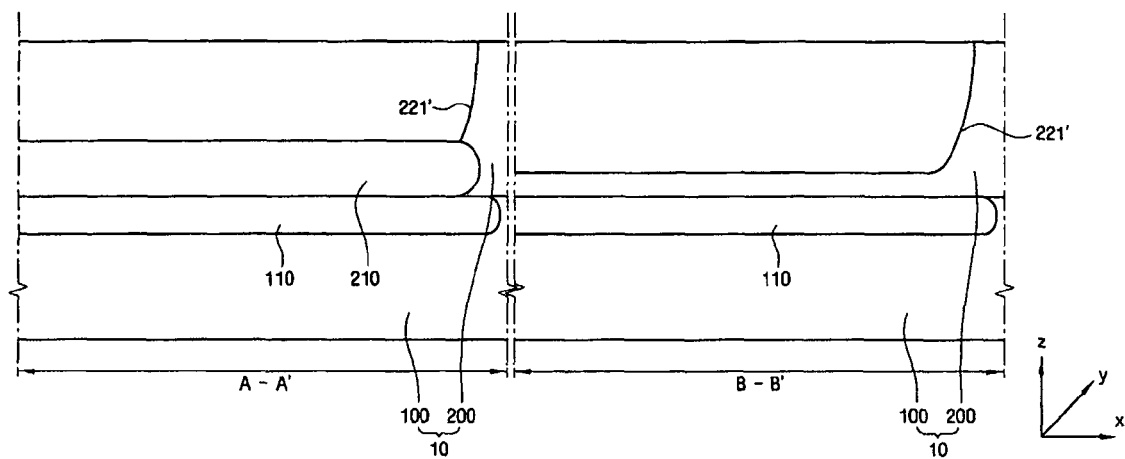
FIG. 14 is a view for explaining a method of fabricating the semiconductor device according to the second exemplary embodiment.

Hereinafter, a method of fabricating the semiconductor device according to the second exemplary embodiment will be described with reference to FIGS. 6, 7, and 14. FIG. 14 is a view for explaining a method of fabricating the semiconductor device according to the second exemplary embodiment of the present invention. For simplicity, a detailed description of processes substantially identical to those included in the method of fabricating the semiconductor device according to the first exemplary embodiment will be omitted.

Referring to FIGS. 6, 7, and 14, the method of fabricating the semiconductor device according to the second exemplary embodiment may be substantially identical to the method of fabricating the semiconductor device according to the first exemplary embodiment except that a pre-drift region 221' is formed to extend deeper into the substrate 10 than the pre-drift region 220' according to the first exemplary embodiment and that an N-type well is not formed.

Referring to FIG. 14, the N-type first buried layer 110 is formed in the P-type bulk substrate 100, and the N-type epitaxial layer 200 is formed on the bulk substrate 100. Then, the P-type second buried layers 210 and the N-type pre-drift region 221' are formed in the epitaxial layer 200.

Specifically, a mask pattern in which regions where the second buried layers 210 are to be formed are defined (specifically, a mask pattern in which the first and second regions I and II of the substrate 10 are defined) is formed on the epitaxial layer 200. Then, P-type impurities are implanted into the epitaxial layer 200 to a depth equal to a top surface of the first buried layer 110 or a lower part of the epitaxial layer 200 disposed on the first buried layer 110 in the first region I of the substrate 10, and the mask pattern is removed to form the second buried layers 210. Next, a mask pattern (not shown) in which a region where the pre-drift region 221' is to be formed is defined is formed on the epitaxial layer 200. Then, N-type impurities are implanted into the epitaxial layer 200 to a depth equal to top surfaces of the second buried layers 210, and the mask pattern is removed to form the pre-drift region 221'. The second buried layers 210 formed as described above may have a higher doping concentration than the epitaxial layer 200 but have a lower doping concentration than the first buried layer 110. In addition, the pre-drift region 221' may have substantially the same doping concentration as the epitaxial layer 200 or may have a higher doping concentration than the epitaxial layer 200.

Referring to FIGS. 6 and 7, first and second element isolation regions 235 and 230 are formed in the epitaxial layer 200, and the P-type body region 250 is formed in the pre-drift region 221', thereby completing the drift region 221. Then, a gate insulating film 233 and a gate 280 are formed, and the source region 260 and the drain region 270 are formed.

Methods of fabricating the semiconductor devices according to the exemplary embodiments of FIGS. 3 through 5 and 8 through 10 may be substantially identical to the methods of fabricating the semiconductor devices according to the first and second exemplary embodiments except that each region (such as first and second buried layers and an N-type well) is formed to have different lengths in first and second directions, and thus a detailed description thereof is omitted.

While embodiments of the present inventive concepts have been particularly shown and described with reference to exemplary embodiments thereof, it will be understood by those of ordinary skill in the art that various changes in form and detail may be made herein without departing from the spirit and scope of the present invention as defined by the following claims. The exemplary embodiments should be considered in a descriptive sense only and not for purposes of limitation.

What is claimed is:

1. A semiconductor device, comprising:
   a substrate;
   a gate that extends on the substrate in a first horizontal direction;
   a source region at a first side of the gate and extending in the first horizontal direction;
   a body region of a first conductivity type under the source region and extending in the first horizontal direction;
   a drain region of a second conductivity type at a second side of the gate and extending in the first horizontal direction;
   a drift region of the second conductivity type and extending between the body region and the drain region in the substrate in a second, intersecting, horizontal direction;
   a first buried layer under the drift region in the substrate, the first buried layer extending in the first and second horizontal directions; and
   a plurality of second buried layers between the first buried layer and the drift region in the substrate, the second buried layers extending in the second horizontal direction and being spaced apart from each other in the first horizontal direction, wherein the first and second buried layers extend from the body region in the second horizontal direction, and wherein the second buried layers extend further than the first buried layer in the second horizontal direction.

2. The semiconductor device of claim 1, wherein the first buried layer is of the second conductivity type, wherein the second buried layers are of the first conductivity type, and wherein the first buried layer has a higher doping concentration than the second buried layers.

3. The semiconductor device of claim 1, wherein the source region comprises a first source region of the first conductivity type and a second source region of the second conductivity type, and wherein the body region contacts the second buried layers.

4. The semiconductor device of claim 1, further comprising an element isolation region between the source region and the drain region in the substrate, wherein the gate is formed on a portion of the drift region and a portion of the element isolation region.

5. The semiconductor device of claim 1, wherein the substrate comprises a bulk substrate of the first conductivity type and an epitaxial semiconductor layer of the second conductivity type on the bulk substrate, wherein the first buried layer is formed in the bulk substrate, wherein the second buried layers are formed in the epitaxial semiconductor layer, and wherein the drift region is spaced apart from the second buried layers and is disposed on the epitaxial semiconductor layer.

6. The semiconductor device of claim 5, further comprising a well of the second conductivity type at the second side of the gate and extending in the first horizontal direction, wherein the well is under the drain region and extends deeper than the drift region in a vertical direction toward the second buried layers.

7. The semiconductor device of claim 6, wherein the first buried layer is of the second conductivity type, wherein the second buried layers are of the first conductivity type, wherein the first buried layer has a higher doping concentration than the second buried layers, and wherein the second buried layers have a higher doping concentration than the well.

8. A semiconductor device comprising:
   a substrate;
   a source region in the substrate along a first horizontal direction;
   a body region of a first conductivity type under the source region and formed in the substrate to extend the first horizontal direction;
   a drain region of a second conductivity type which is spaced apart from the body region in a second horizontal direction and extending in the first horizontal direction;
   a drift region of the second conductivity type extending from the body region to the drain region in the substrate in a second, intersecting, horizontal direction;
   a first buried layer under the drift region and extending from the body region in the second horizontal direction; and
   a second buried layer between the first buried layer and the drift region and extending from the body region further than the first buried layer in the second horizontal direction.

* * * * *